United States Patent [19]

Noro et al.

[11] Patent Number: 5,570,091
[45] Date of Patent: Oct. 29, 1996

[54] ANALOG-TO-DIGITAL CONVERTER

[75] Inventors: Masao Noro; Takayuki Kohdaka, both of Hamamatsu, Japan

[73] Assignee: Yamaha Corporation, Hamamatsu, Japan

[21] Appl. No.: 310,283

[22] Filed: Sep. 21, 1994

[30] Foreign Application Priority Data

Sep. 21, 1993 [JP] Japan ................................. 5-257736
Oct. 25, 1993 [JP] Japan ................................. 5-288624

[51] Int. Cl.$^6$ ............................... H03M 1/38; H03M 1/12
[52] U.S. Cl. ............................................. 341/161; 341/155
[58] Field of Search ............................ 341/139, 155, 341/162, 163, 156, 159

[56] References Cited

U.S. PATENT DOCUMENTS

| | | | |
|---|---|---|---|
| 4,851,842 | 7/1989 | Iwamatsu | 341/139 |
| 4,983,969 | 1/1991 | Iwamoto et al. | 341/118 |
| 5,262,686 | 11/1993 | Kurosawa | 307/362 |

Primary Examiner—Jeffrey A. Gaffin
Assistant Examiner—Jason L. W. Kost
Attorney, Agent, or Firm—Loeb & Loeb LLP

[57] ABSTRACT

An analog-to-digital converter mainly comprises an analog-to-digital conversion unit which produces a digital output, as an equivalent of an analog input supplied thereto, by performing a successive approximation. Herein, an instantaneous value of the analog input is compared with a reference signal so as to determine the digit in each of the bits of the digital output. The analog-to-digital converter can further comprise an analog comparator, an analog amplifier and a digital attenuator in order to reduce an effect of the noise. The analog amplifier amplifies the analog input by a gain so as to produce an intermediate analog signal. The analog-to-digital conversion unit converts the intermediate analog signal into an intermediate digital signal. The digital attenuator attenuates the intermediate digital signal by an attenuation rate so as to produce the digital output. The attenuation rate is determined such that a product, obtained by multiplying the gain and attenuation rate together, is normally equal to a value '1'. The analog comparator evaluates the level of the analog input by comparing it with predetermined levels in turn. Thus, the analog comparator controls the gain of the analog amplifier in accordance with a result of the evaluation.

16 Claims, 9 Drawing Sheets

ANALOG-TO-DIGITAL CONVERTER

BACKGROUND OF THE INVENTION

The present invention relates to an analog-to-digital converter, and particularly to a successive-approximation-type analog-to-digital converter.

A successive-approximation-type analog-to-digital converter (or a successive-approximation-type A/D converter) comprises a reference-voltage generating circuit and a comparison circuit. Herein, the reference-voltage generating circuit generates a reference voltage whose level is successively altered. The comparison circuit compares the reference voltage with an analog input, which is sampled and held, so as to determine the digit of each bit in the digital output to be produced by converting the analog input. FIG. 1 shows an example of the A/D converter. A sample-and-hold circuit (hereinafter, simply referred to as a S/H circuit) 1 receives an analog-input voltage from an input terminal 6 so as to sample and hold it. A digital-to-analog converter (hereinafter, simply referred to as a D/A converter or DAC) 2 is provided to generate the reference voltage. Either the output of the D/A converter 2 and the output of the S/H circuit 1 is applied to one terminal of a capacitor C1 through switches $S_1$ and $S_2$. Another terminal of the capacitor $C_1$ is connected with an input terminal of an inverter $I_1$. A switch $S_3$ is connected in parallel with the inverter $I_1$. All of the capacitor $C_1$, the inverter $I_1$ and the switch $S_3$ are connected together to form a comparison circuit 3.

In FIG. 1, an output terminal of the inverter $I_1$ is connected with a series circuit comprising a capacitor $C_2$, an inverter 12, a capacitor $C_3$, an inverter 13 and an inverter 14. The inverter 12 is connected in parallel with a switch $S_4$, while the inverter 13 is connected in parallel with a switch $S_5$. The reason why the multiple inverters are connected together is to obtain a sufficient gain which is required for performing a comparing operation with respect to a LSB voltage of the D/A converter 2 (where 'LSB' is an abbreviation for 'least significant bit'). An output of the inverter 14 is supplied to successive-approximation-conversion logic circuit (hereinafter, simply referred to as a logic circuit) 4. The logic circuit 4 produces data, representative of an essential element for the generation of the reference voltage, so that this data is supplied to the D/A converter 2. The logic circuit 4 further controls the switches $S_1$ to $S_5$.

The above-mentioned A/D converter can be configured by a CMOS-type IC (where CMOS is an abbreviation for 'complementary metal-oxide semiconductor'). In that case, all of the circuits in the A/D converter, except the S/H circuit 1, can be fabricated in one-chip IC. The D/A converter 2 can be configured by a resistor-string-type circuitry using the CMOS. As each of the switches $S_1$ to $S_5$, a CMOS switch is used. In addition, the capacitor can be configured by an oxidation film or the like in the IC chip.

One comparing operation to be effected between the output of the S/H circuit 1 and the output of the D/A converter 2 is performed in two cycles. In first cycle, all of the switches $S_1$ $S_3$, $S_4$ and $S_5$ are turned on, while the switch $S_2$ is turned off. In this cycle, all of the inverters $I_1$ to 13, each configured by the CMOS circuit, are shorted; hence, the same electric potential is applied to input and output terminals of the inverter and is equal to a half of the power-supply voltage VDD; in other words, the electric potential applied to the inverter is reset to center potential. Since the alternating signal is inputted to the circuitry shown in FIG. 1, the center potential is set at zero level. In this state, the output voltage of the D/A converter 2 is supplied to the capacitor $C_1$ through the switch $S_1$ so that the capacitor $C_1$ is charged. In other words, the output potential of the D/A converter 2 is applied to one terminal of the capacitor $C_1$, while the center potential, given by the inverter, is applied to another terminal of the capacitor $C_1$.

In next cycle, the switches $S_1$, $S_3$, $S_4$ and $S_5$ are turned off, while the switch $S_2$ is turned on. This enables each of the inverters $I_1$ to 13 to perform an inverting operation. As a result, the output of tile S/H circuit 1 is supplied to the capacitor $C_1$. If the output of the S/H circuit 1 is higher than the reference voltage, an input potential of the inverter $I_1$ should be higher than the center potential. On the other hand, if the output is lower than the reference voltage, the input potential of the inverter $I_1$ should be lower than the center potential. Thus, one of the digits '0' and '1' is selectively determined for each of the bits in the digital output in response to the level relationship between the input potential of the inverter $I_1$ and the center potential.

Thereafter, the comparing operation, as described above, is repeatedly performed a certain number of times, the number of which corresponds to the number of the bits included in the digital output to be produced. Herein, the comparing operation is performed on the basis of the reference voltage whose level is successively altered.

In general, the A/D converter particularly used for the audio device is designed to produce the digital output of twelve bits to sixteen bits. Therefore, the D/A converter, which is equipped inside of the A/D converter, should be designed to receive the digital input of twelve bits to sixteen bits. Since a relatively large number of bits are required for the digital output produced by the A/D converter, it is required to realize an extremely high resolution for the comparison circuit. In addition, it is also requested to increase the conversion speed of the A/D converter. This is a contradictory situation for the A/D converter, because in the known A/D converter, a higher resolution may result in a lower conversion speed.

In the one-chip A/D converter, both of the analog signal and digital signal exist inside of the chip. This means that the noises, which may be produced by the digital circuit, are easy to be transferred to the analog circuit. In addition, the comparison circuit 3 should have a relatively large gain; hence, the comparison circuit 3 is easily affected by the noises. In order to reduce a bad effect of the noises, the capacity of each of the capacitors $C_1$ to $C_3$ should be increased to be larger than a certain degree of capacity so that the impedance will be decreased. Among those capacitors, especially the capacitor $C_1$ should be increased in the capacity, because this capacitor $C_1$ deals with the signal whose level is the smallest.

However, the conversion speed depends upon the time which is required for charging the capacitor $C_1$ by the D/A converter 2. Since the D/A converter 2 has a limited output impedance, an increase in the capacity of the capacitor $C_1$ results in a decrease in the conversion speed of the A/D converter.

In short, it is difficult for the integrated A/D converter to simultaneously realize the improvement in the resolution and S/N ratio as well as the increase of the conversion speed.

FIG. 2 shows another example of the successive-approximation-type A/D converter. In FIG. 2, an analog input is supplied to a sample-and-hold circuit (i.e. ,S/H circuit) 11 which performs sample-and-hold operations. Thus, each of the instantaneous values sequentially produced from the S/H circuit 11 is supplied to a comparator 12. The comparator 12 compares the instantaneous value with an output (i.e., an analog output) of a D/A converter 13. The D/A converter 13 receives four-bit data consisting of four bits M0, M1, M2 and M3, wherein 'M0' corresponds to the most significant bit (i.e., MSB) and 'M3' corresponds to the least significant bit (i.e., LSB). The four-bit data is produced by a successive-approximation circuit 14 on the basis of an output of the comparator 12.

The successive-approximation circuit 14 contains a four-bit successive-approximation register (i.e.. 4-bit SAR) and a control circuit (not shown). The control circuit changes each of the digits of the bits M0 to M3 in a manner as shown in FIG. 3B in response to the output of the comparator 12 which has the digit '0' or '1'. As shown in FIG. 3A, the comparator 12 performs the comparing operation at each of four moments t1, t2, t3 and t4. At first moment t1, the digit 1 is set to the most significant bit 'M0' only, so that the D/A converter 13 produces an analog output whose level corresponds to the four-bit data '1000'. This analog output is supplied to the comparator 12. Hence, the comparator 12 compares the analog output with the instantaneous value of the analog input.

In the graph of FIG. 3A, a height of the bar represents the level of the analog output of the D/A converter 13 at each moment. At the moment t1, the level of the analog output is greater than the instantaneous value of the analog input. Therefore, the control circuit Judges that the digit 1 set to the bit 'M0' is not appropriate. At this time, the comparator 12 produces the output having the digit 0. Hence, under the control of the control circuit, the digit 0 is set to the bit M0 at the next moment t2, while the digit 1 is set to the bit M1 only. Thus, the D/A converter 13 produces the analog output on the basis of the four-bit data '0100'. Then, the comparator 12 performs the comparing operation with respect to this analog output.

At the moment t2, the instantaneous value of the analog input is greater than the level of the analog output. Therefore, at the moment t3, the control circuit increases the four-bit data to the data '0110'. Then, the comparing operation is performed again. As described heretofore, the comparing operation is successively performed. Thus, finally, it is possible to obtain the analog output of the D/A converter 13, the level of which is tile closest to the instantaneous value of the analog input. Based on the final analog output, the A/D converter shown in FIG. 2 will produce the final digital output. Since the A/D converter shown in FIG. 2 is configured as the four-bit converter, the comparing operation is repeatedly performed four times. Thus, the analog output of the D/A converter 13 at the final moment t4 will be converted into the final digital output of the A/D converter.

Generally speaking, in the successive-approximation-type A/D converter as well as the normal A/D converters, the precision of conversion and the limit of the S/N ratio depend upon the internal noise which occurs in the conversion system of the A/D converter. For example, when the noise is introduced into the comparator at the timing to perform the comparing operation, this noise greatly affects the output of the A/D converter. Such problem is easily created in the monolithic LSI. In the monolithic LSI, both of the analog circuit and digital circuit are integrated; in other words, the A/D converter is fabricated on the same substrate together with the other digital circuits. The reason why the above-mentioned problem is easily created in the monolithic LSI is that the noise from the digital system frequently dominates (or greatly affects) the noise of the A/D converter.

SUMMARY OF THE INVENTION

It is an object of the present invention to provide a successive-approximation-type analog-to-digital converter which can realize the high performance and high conversion speed.

It is another object of the present invention to provide an analog-to-digital converter which has an improved S/N ratio as well as an improved precision of conversion.

An analog-to-digital converter, according to the present invention, mainly comprises an analog-to-digital conversion unit which produces a digital output, as an equivalent of an analog input supplied thereto, by performing a successive approximation. Herein, an instantaneous value of the analog input is compared with a reference signal so as to determine the digit in each of the bits of the digital output. In order to reduce an effect of the noise, the analog-to-digital converter further comprises an analog comparator, an analog amplifier and a digital attenuator. The analog amplifier amplifies the analog input by a gain so as to produce an intermediate analog signal. The analog-to-digital conversion unit converts the intermediate analog signal into an intermediate digital signal. The digital attenuator attenuates the intermediate digital signal by an attenuation rate so as to produce the digital output. The attenuation rate is determined such that a product, obtained by multiplying the gain and attenuation rate together, is normally equal to a value '1'. The analog comparator evaluates the level of the analog input by comparing it with predetermined levels in turn. Thus, the analog comparator controls the gain of the analog amplifier in accordance with a result of the evaluation.

BRIEF DESCRIPTION OF THE DRAWINGS

Further objects and advantages of the present invention will be apparent from the Following description, reference being had to the accompanying drawings wherein the preferred embodiments of the present invention are clearly shown.

In the drawings.

DESCRIPTION OF THE PREFERRED EMBODIMENTS

[A] First embodiment

Figure 1:
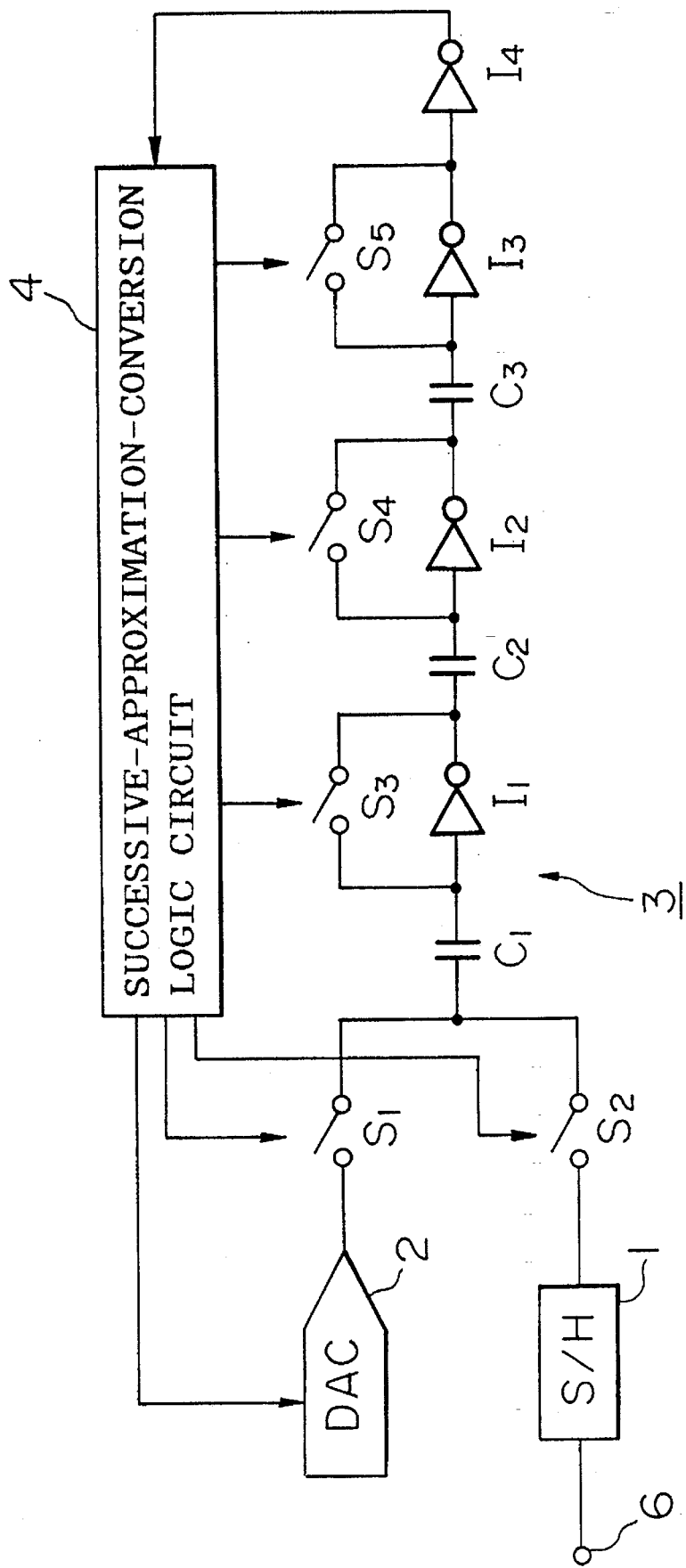
FIG. 1 is a block diagram showing an example of a successive-approximation-type A/D converter.
Figure 4:
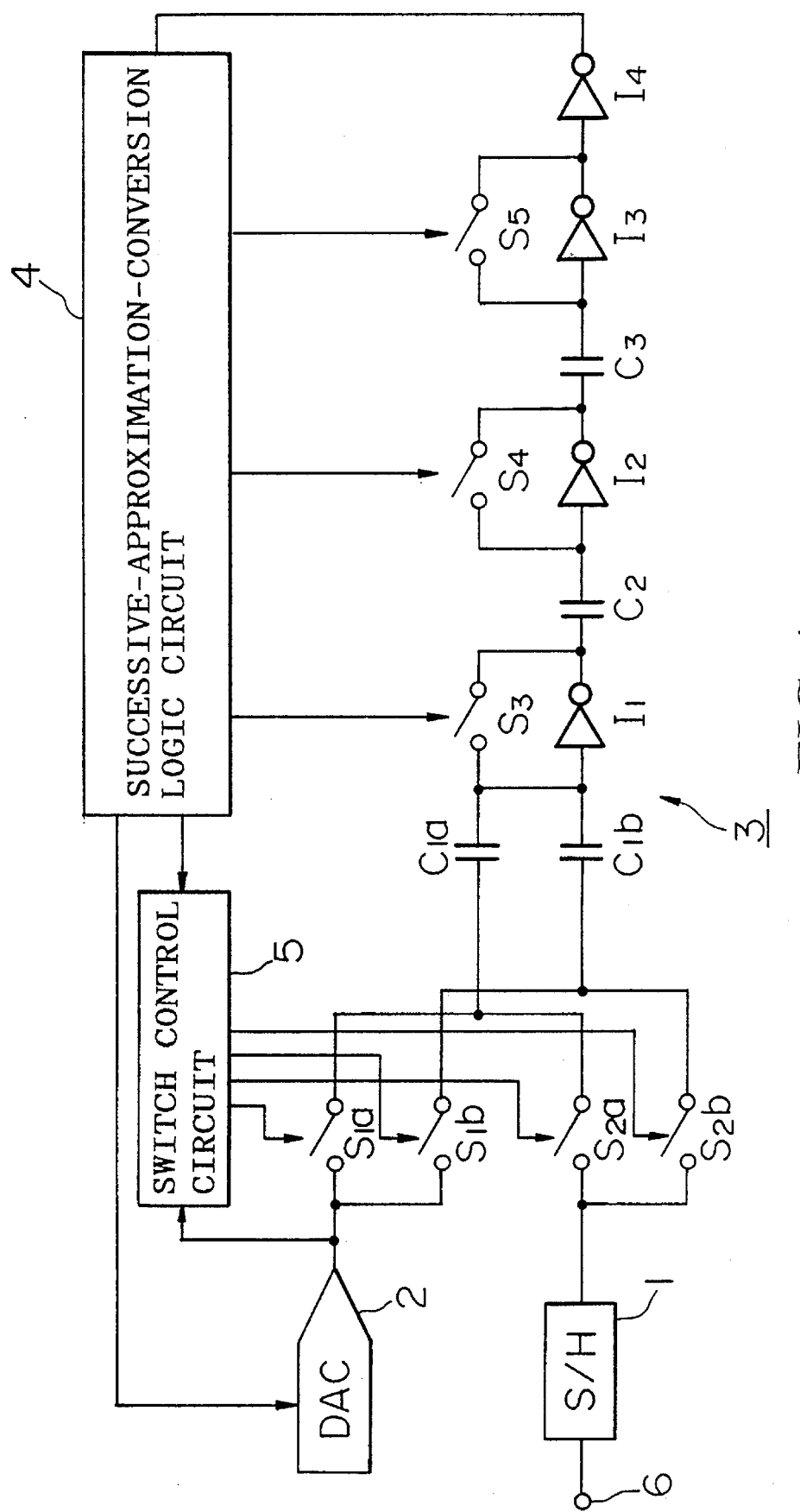
FIG. 4 is a block diagram showing a successive-approximation-type A/D converter according to a first embodiment of the present invention.

FIG. 4 is a block diagram showing an A/D converter according to a first embodiment of the present invention. In FIG. 4, the parts identical to those shown in FIG. 1 are designated by the same numerals; hence, the detailed description thereof will be omitted. As compared to the A/D converter shown in FIG. 1, the A/D converter shown in FIG. 4 is characterized by that the switch $S_1$ is replaced by two switches $S_{1a}$ and $S_{1b}$ and the switch $S_2$ is also replaced by two switches $S_{2a}$ and $S_{2b}$. As described before, the function of the switch $S_1$ is to transfer the analog output of the D/A converter 2 to the comparison circuit 3; and the function of the switch $S_2$ is to transfer the output of the S/H circuit 1 (i.e., the equivalent of the analog-input voltage which is sampled and held by the S/H circuit 1) to the comparison circuit 3. In addition, the capacitor $C_1$ shown in FIG. 1 is replaced by two capacitors $C_{1a}$ and $C_{1b}$. Herein, one terminal of the capacitor $C_{1a}$ is connected with the switches $S_{1a}$ and $S_{2a}$; and one terminal of the capacitor $C_{1b}$ is connected with the switches $S_{1b}$ and $S_{2b}$. Both of another terminals of the capacitors $C_{1a}$ and $C_{1b}$ are connected to a connection point between the inverter $I_1$ and the switch $S_3$. In the first embodiment, both of the capacitors $C_{1a}$ and $C_{1b}$ have the same capacity. That is, all of the capacitors $C_{1a}$, $C_{1b}$ and $C_1$ are equivalent with each other in terms of the capacity (i.e., $C_{1a}=C_{1b}=C_1$).

Figure 6:
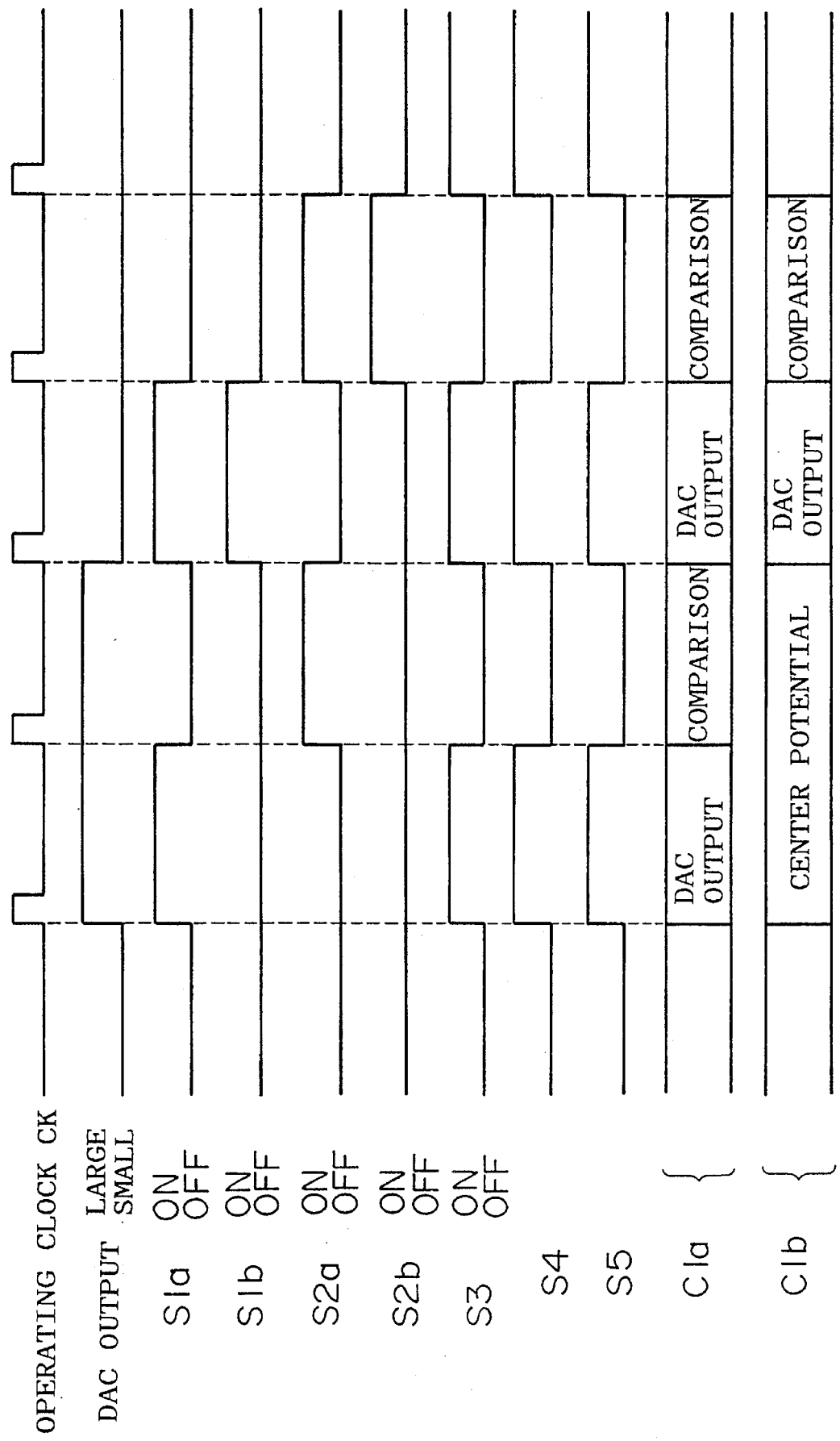
FIG. 6 is a timing chart showing operations of switches and capacitors used in the A/D converter shown in FIG. 4.

Further, there is provided a switch control circuit 5 which controls the on/off states for each of the switches $S_{1a}$, $S_{1b}$, $S_{2a}$ and $S_{2b}$ in response to the level of the analog output of the D/A converter 2. The switch control circuit 5 detects the level (or absolute value) of the analog output of the D/A converter 2. The switch control circuit 5 contains a window comparator (not shown) which is used to perform a judgement as to whether or not the detected level of the analog output belongs to a predetermined range. Herein, the center of that range corresponds to the aforementioned center potential. Based on the result of the judgement, the switch control circuit 5 changes the connection of the capacitor $C_{1a}$ against the switches $S_{1a}$ and $S_{2a}$ as well as the connection of the capacitor $C_{1b}$ against the switches $S_{1b}$ and $S_{2b}$. FIG. 6 is a timing chart showing the relationship between the on/off states of the switches and the potential level of the capacitors $C_{1a}$ and $C_{1b}$.

Under a first state where the analog output of the D/A converter 2 is not close to the center potential or the analog-output level is relatively large, both of the switches $S_{1b}$ and $S_{2b}$ are remained in the off-state, so that the switches $S_{1a}$ and $S_{2a}$ are alternately turned on. In this state, only the capacitor $C_{1a}$ is used. Under a second state where the analog output of the D/A converter 2 is close to the center potential or the analog-output level is relatively small, a pair of the switches $S_{1a}$, $S_{1b}$ and a pair of the switches $S_{2a}$, $S_{2b}$ are alternately turned on. Herein, the switches $S_{1a}$ and $S_{1b}$ are simultaneously turned on in order to transfer the analog output of the D/A converter 2 to the comparison circuit 3; and the switches $S_{2a}$ and $S_{2b}$ are simultaneously turned on in order to transfer the output of the S/H circuit 1 to the comparison circuit 3. In the second state, the two capacitors $C_{1a}$ and $C_{1b}$, which are connected together in parallel, are simultaneously used. This means that two comparison systems, each having a different value in capacity, are formed within the comparison circuit 3 in response to the level of the analog output of the D/A converter 2.

Figure 7:
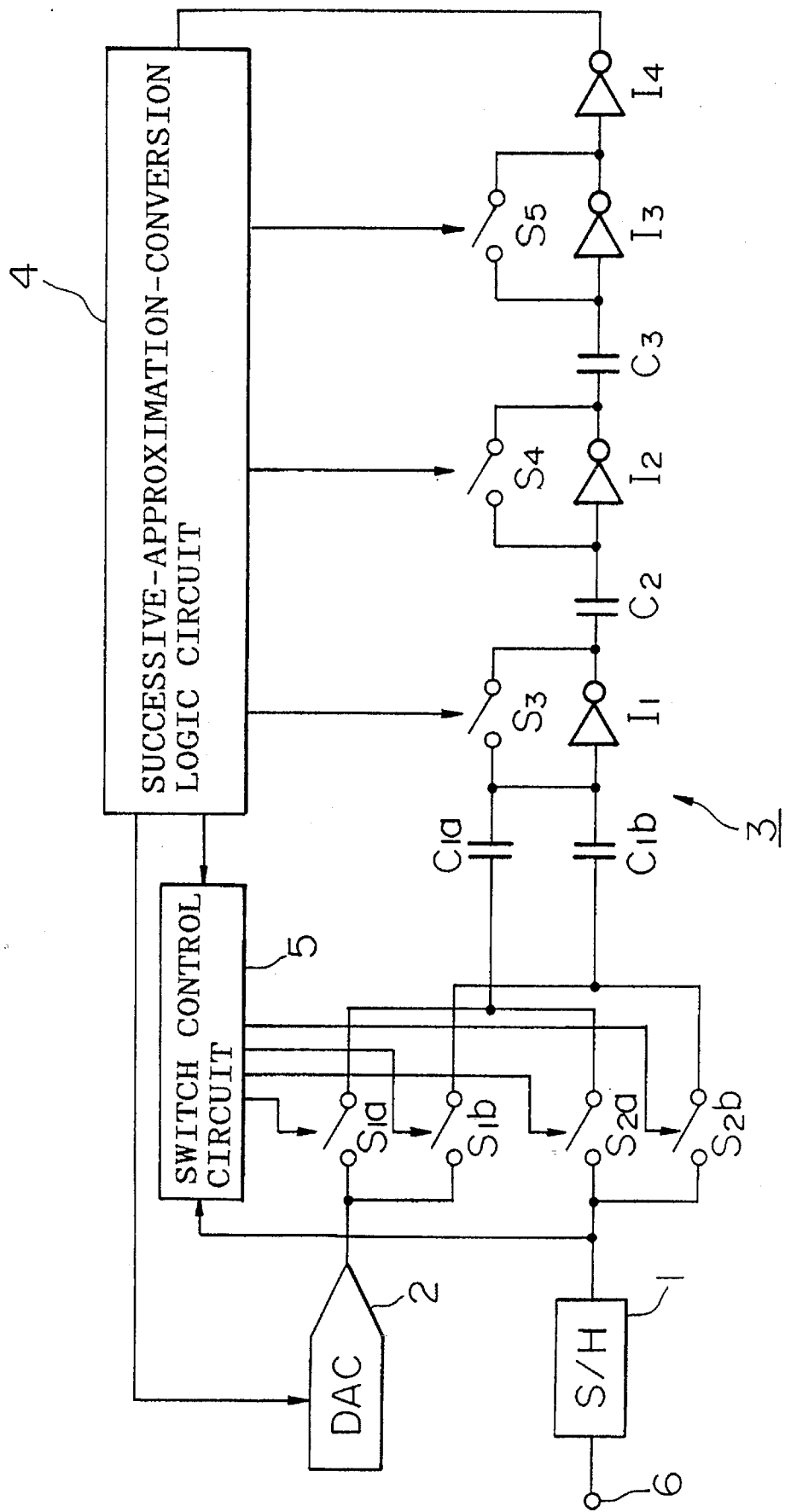
FIG. 7 is a block diagram showing a modified example of the A/D converter according to the first embodiment.

In the first embodiment shown in FIG. 4, the level of the analog-input voltage, which is applied to the input terminal 6 and is sampled and held by the S/H circuit 1, is evaluated on the basis of the analog output of the D/A converter 2 which is used to charge the capacitors $C_{1a}$ and $C_{1b}$. However, it is possible to modify the first embodiment such that the evaluation of the level of the analog-input voltage is performed directly on the basis of the output of the S/H circuit 1. FIG. 7 shows a modified example of the first embodiment. Incidentally, the analog output of the D/A converter 2 is determined by the digital data inputted to the D/A converter 2. Therefore, the evaluation can be performed by use of the digital data inputted to the D/A converter 2. In that case, a digital comparator is employed. On the other hand, in order to detect the analog output of the D/A converter 2 and in order to detect the output of the S/H circuit 1, it is necessary to use an analog comparator. In contrast, when the detection is performed with respect to the digital data only, the overall circuit of the A/D converter can be fabricated by the digital circuits only.

Next, a fundamental principle of the first embodiment will be described in detail.

In general, the audio signal is like an alternating signal whose amplitude is altered up and down from the center potential which is the center of the power-supply voltage. Before performing the comparing operation, in other words, in the state where the switches $S_3$ to $S_5$ are turned on, the center potential is applied to the inverter as described before. If the level of the analog-input voltage is relatively small, the output level of the D/A converter 2, at a timing at which the successive approximation is completed so that the digital data is certainly defined, is roughly equal to the center potential; hence, the charged voltage of the capacitor should be relatively small.

A curve representative of a progress of a charging operation of the capacitor by the D/A converter 2 is a logarithmic curve which is determined by the output impedance of the D/A converter 2 and the capacity of the capacitor. A charging time required for charging the capacitor is equivalent to the time by which the charged potential of the capacitor reaches the output potential of the D/A converter 2. If an error, between the charged potential and the output potential, becomes less than an equivalent of (½)LSB, the precision of conversion may be sufficient. In other words, it is not necessary to accurately measure the time by which the charged potential becomes accurately equal to the output potential of the D/A converter 2. So, the time, by which the charged potential becomes roughly equal to the output potential of the D/A converter 2 with a certain error which corresponds to (½)LSB, can be used as the charging time. If the analog-to-digital conversion is performed in a time which is shorter than the above-mentioned charging time, the precision of conversion of the A/D converter may be reduced. In short, an allowable error for the measurement of the charging time is set equivalent to (½)LSB. This allowable error remains constant, regardless of the level of the signal inputted to the capacitor. This means that the charging time to be measured, which satisfies the allowable error (i.e., (½)LSB), is differed in response to the level of the input voltage applied to the capacitor.

Figure 5:
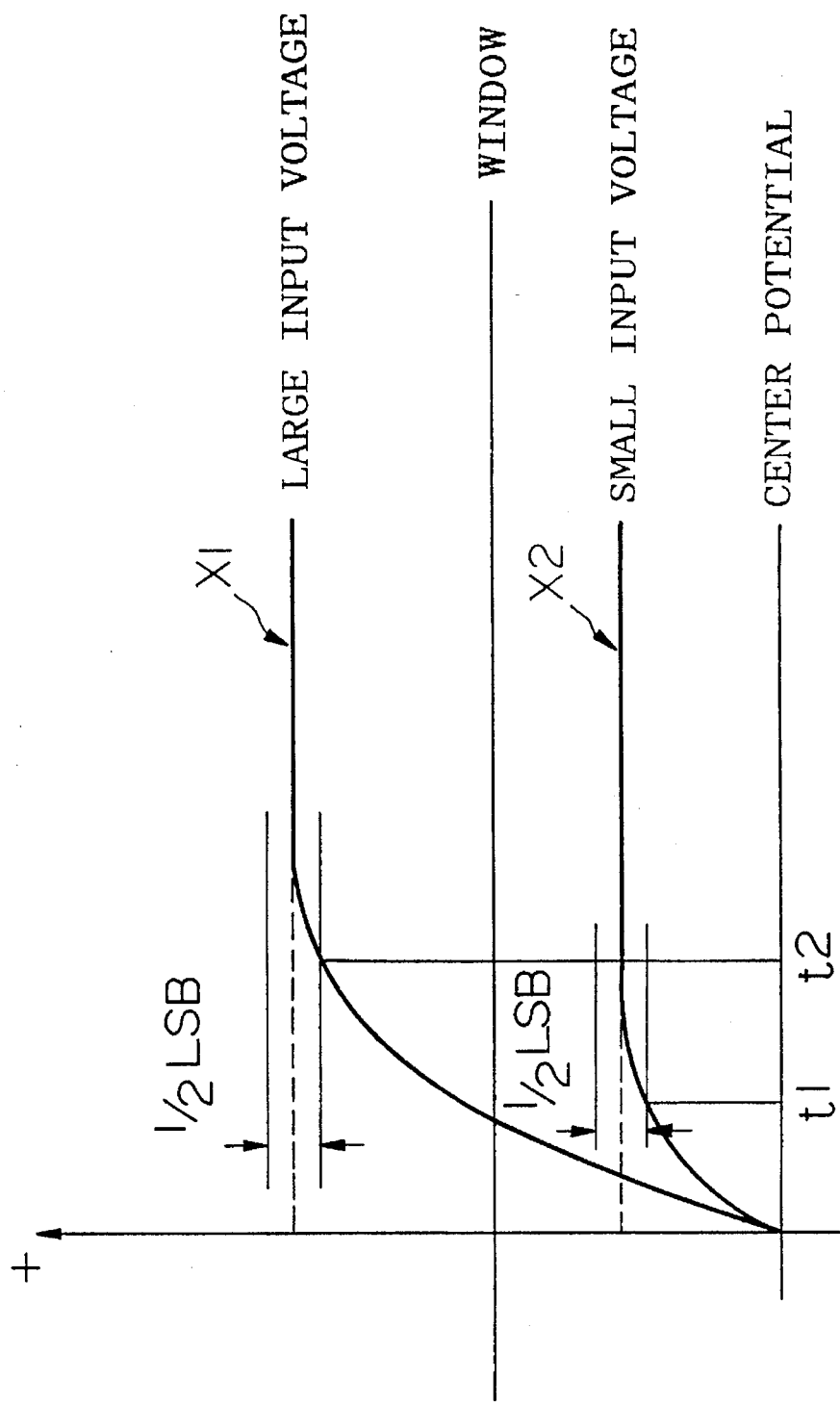
FIG. 5 is a graph showing a charging operation of a capacitor in response to a level of an input voltage.

FIG. 5 is a graph which is used to explain that the charging time for the capacitor is differed in response to the level of the input voltage applied to the capacitor. FIG. 5 shows two curves X1 and X2, each of which corresponds to the same capacity (i.e., impedance) of the capacitor, in other words, each of which has the same time constant for the charging operation. Each curve shows a progress of the charging operation for the capacitor in a lapse of time. The upper curve X1 corresponds to the charging operation for the capacitor to which a relatively large input voltage is applied, while the lower curve X2 corresponds to the charging operation for the capacitor to which a relatively small input voltage is applied. Once the input voltage is applied to the capacitor, the charging potential of the capacitor increases from tile center potential to the target voltage, i.e., the input voltage to the capacitor. As described above, the allowable error is set for the target voltage. As for the curve X1, a charging time t1 is required for the completion of the charging operation by which the charging potential increases from the center potential and then reaches the small input voltage with the allowable error. As for the curve X2, a charging time t2 is required for the completion of the charging operation by which the charging potential increases from the center potential and then reaches the large input voltage. As shown in FIG. 5, the charging time t1 for the curve X2 is shorter than the charging time t2 for the curve X1. This means that the charging time required for charging the small input voltage to the capacitor is shorter than the charging time required for charging the large input voltage to the capacitor.

The present embodiment is designed in such a manner that only one capacitor $C_{1a}$ is used when the analog-input voltage is large but the two capacitors $C_{1a}$ and $C_{1b}$ are simultaneously used when the analog-input voltage is small. In short, the time constant for the charging operation is differed in response to the level of the analog-input voltage. Thus, a high-speed charging operation can be performed even if the analog-input voltage is large.

In general, the so-called masking effect may work to cancel the noise of the audio signal under the state where the level of the audio signal is high; however, the noise will be easily heard by the listener when the level of the audio signal becomes low. The present embodiment can eliminate such problem. Namely, the present embodiment is designed such that if the signal level is low, the capacity of the capacitor is increased. Thus, the S/N ratio for the low signal level can be improved.

As described heretofore, the present embodiment provides the two capacitors, both of which have the same capacity. In addition, the present embodiment is designed such that the two capacitors, connected in parallel, are simultaneously used in connection with the low signal level, whereas only one capacitor is used in connection with the high signal level. However, the present embodiment can be modified to provide two capacitors each having a different capacity. In that modification, those capacitors are alternately used in response to the signal level. Further, it is possible to further modify the present embodiment such that a plurality of capacitors are provided and are connected in parallel.

[B] Second embodiment

Figure 8:
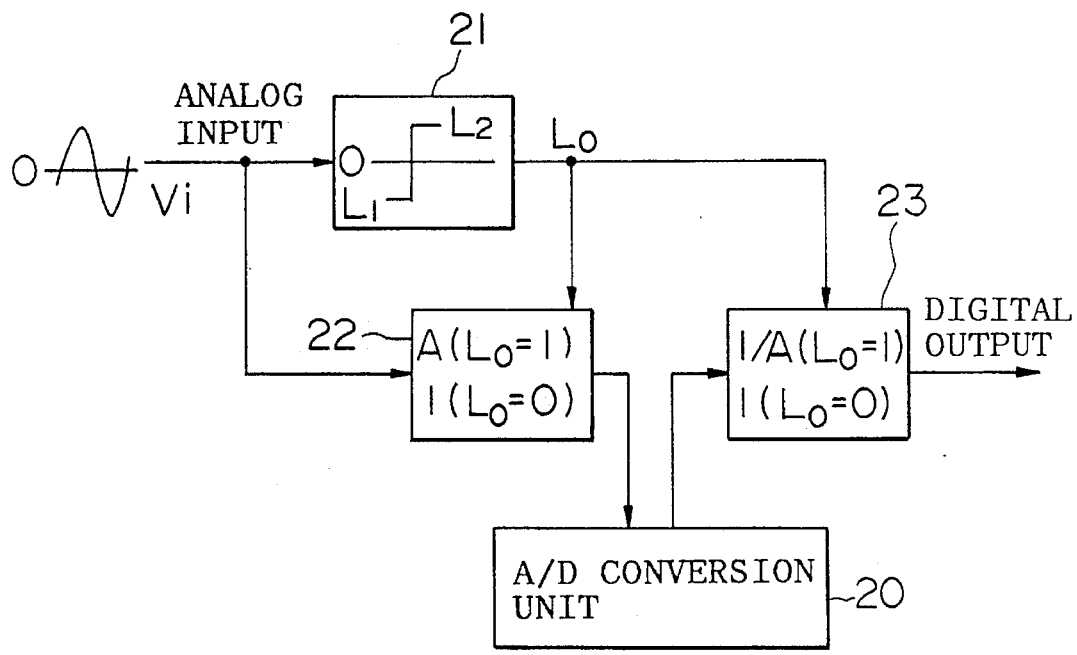
FIG. 8 is a block diagram showing an A/D converter according to a second embodiment of the present invention.
Figure 2:
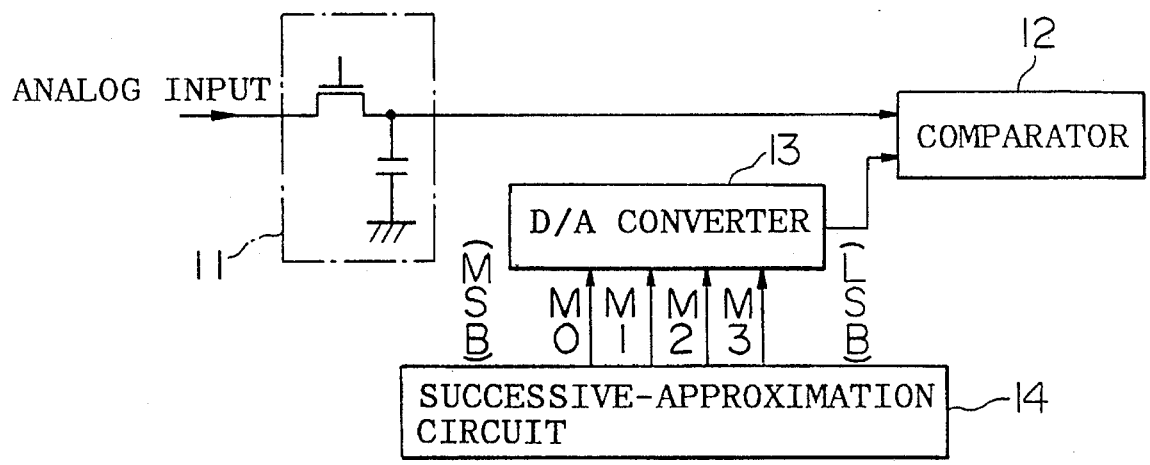
FIG. 2 is a block diagram showing another example of a successive-approximation-type A/D converter.
Figures 3A, 3B:
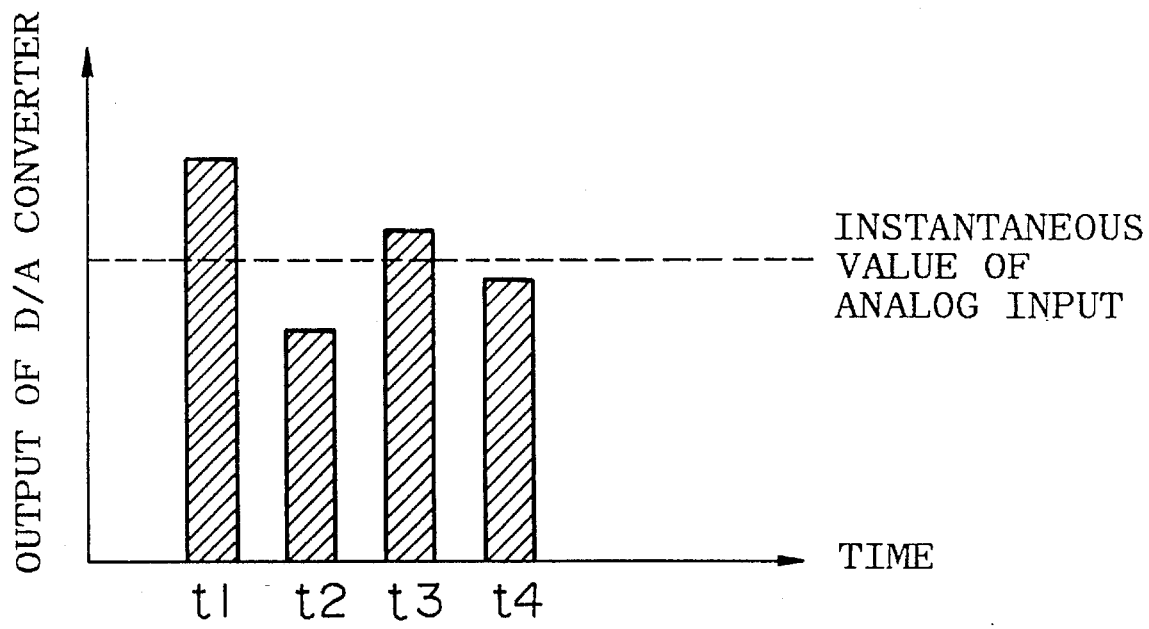
FIG. 3A is a graph which is used to explain operations of the A/D converter shown in FIG. 2.
FIG. 3B is a drawing which is used to explain operations of the A/D converter shown in FIG. 2.

FIG. 8 is a block diagram showing an A/D converter according to a second embodiment of the present invention. In FIG. 8, an A/D conversion unit 20 has a configuration which is shown in FIG. 2, for example. Therefore, the second embodiment is characterized by further providing an analog comparator 21, an analog amplifier 22 and a digital attenuator 23 in addition to the A/D conversion unit 20.

The analog amplifier 22 amplifies the analog input by a gain whose value is '1' or more. Then, an amplified analog input, outputted from the analog amplifier 22, is supplied to the A/D conversion unit 20 as an intermediate analog signal. The A/D conversion unit 20 performs an analog-to-digital conversion, using an attenuation rate whose value is '1' or less, on the intermediate analog signal so as to produce an intermediate digital signal. The digital attenuator 23 attenuates the intermediate digital signal so as to produce the digital output which is finally outputted from the A/D converter shown in FIG. 8. The analog comparator 21 evaluates the level of the analog input by use of three stages of level; hence, it is judged which stage the level of the analog input belongs to. A certain relationship is established between the gain of the analog amplifier 22 and the attenuation rate of the digital attenuator 23 in such a manner that the product, obtained by multiplying the gain and attenuation rate together, is normally equal to '1'. In some case, the level of the analog input is so small that the effect of the noise apparently emerges and badly affects the analog-to-digital conversion performed by the A/D conversion unit 20. In that case, the analog comparator 21 controls the gain of the analog amplifier 22 such that the gain is made greater than The analog comparator 21 is designed to produce a comparison output '$L_0$' on the basis of an amplitude of the analog input 'Vi' which is an alternating signal. Herein, a low level '$L_1$' and a high level '$L_2$' are set on the basis of a reference level (i.e., zero level); hence, the amplitude of the analog input Vi is compared with those levels. For example, when the amplitude of the analog input Vi is higher than the high level $L_2$ (i.e., Vi>$L_2$), the analog comparator 21 sets the comparison output $L_0$ at zero. On the other hand, when the amplitude of the analog input Vi exists between the low level $L_1$ and high level $L_2$ (i.e., $L_1 \leq Vi \leq L_2$), the analog comparator 21 sets the comparison output $L_0$ at '1'. The analog comparator 21 is configured as a window comparator. When the amplitude of the analog input Vi is lower than the low level $L_1$ (i.e., Vi<$L_1$), the analog comparator 21 sets the comparison output at zero.

The comparison output $L_0$ produced by the analog comparator 21 are used to control the gain of the analog amplifier 22 and the attenuation rate of the digital attenuator 28. A two-step change is made for the gain and attenuation rate in accordance with the value (i.e., '1' or '0') of the comparison output $L_0$, as described below.

At first, when the amplitude of the analog input Vi is higher than the high level $L_2$ or is lower than the low level $L_1$, the comparison output $L_0$ is set at zero. At this time, the gain of the analog amplifier 22 is set at '1'; and the attenuation rate of the digital attenuator 23 is also set at '1'. In this case, both of the analog amplifier 22 and the digital attenuator 23 do not work substantially as if functions of those circuits are omitted. Such control for the gain and attenuation rate is made by the present embodiment because the A/D converter, shown in FIG. 8, is hardly affected by the noise as long as the absolute value in the amplitude of the analog input Vi is sufficiently large.

Secondly, when the amplitude of the analog input Vi exists between the low level $L_1$ and high level $L_2$, the comparison output $L_0$ is set at '1'. At this time, the gain of the analog amplifier 22 is increased to 'A' (where A>1); and the attenuation rate of the digital attenuator 23 is decreased to '1/A'. A total gain of the A/D converter shown in FIG. 8 is expressed by a mathematical expression of "A×(1/A)". So, the total gain at this time is calculated as follows:

$$A \times (1/A) = 1$$

Hence, the second state where $L_O=1$ is equivalent to the first state where $L_0=0$ in terms of the total gain. However, in the second state, the intermediate analog signal is increased to the 'A'-times of the analog input, so that the effect of the noise, which is generated by the digital system in the A/D conversion unit 20, is reduced. In other words, the S/N ratio of the A/D converter is improved; and the precision of conversion is also improved.

The level of the comparison output $L_0$, produced by the analog comparator 21 can be determined reversely, regardless of the second embodiment described above. The analog comparator 21, employed by the second embodiment, uses three stages of level for the evaluation of the level of the analog input. However, it is possible to increase the number of stages. In addition, it is possible to modify the second embodiment such that the amplification degree of the analog amplifier 22 and the attenuation degree of the digital attenuator 23 are increased or decreased exponentially. In that case, it is possible to perform a fine control on the gain of the analog amplifier 22 and the attenuation rate of the digital attenuator 23.

As the digital attenuator 23, it is possible to employ a general-use configuration. For example, the digital attenuator 23 can be at least configured by a shift register and an adder. If the digital attenuator 23 merely requires a small attenuation of 24 dB, the digital attenuator 23 can be configured by the shift register, which is capable of performing a 4-bit down-shift operation, only.

In short, the A/D converter according to tile second embodiment is designed to amplify the analog input, whose is smaller than the noise level, to the intermediate analog signal whose level is much greater than the noise level. Thus, it is possible to almost eliminate the bad effect of the noise which the conventional A/D converter suffers from. In other words, by employing the amplification, the precision of conversion and the S/N ratio are improved in connection with the analog input having a micro level. However, the amplification to the analog input may introduce an increase in the digital output. So, the digital attenuator 23 is employed to cancel the effect of the amplification by performing an attenuation operation. This attenuation operation is also effective in the reduction of the noise.

Next, the effect of the second embodiment will be described by studying an example of the A/D converter, contained in the LSI in which both of the analog and digital circuits are fabricated. If the total of the noises occurred in the A/D converter and the digital circuit is expressed by 75 dB in the S/N ratio, the A/D converter whose S/N ratio is 99 dB can be embodied as described below.

For example, the analog input whose level is below the micro level (e.g., −66 dB) is amplified in the analog amplifier 22 by the gain 'A' which corresponds to 24 dB. As a result, the level of the intermediate analog signal, which is inputted to the A/D conversion unit 20, is changed from −99 dB to −75 dB. This level of −75 dB can realize a satisfactory precision of conversion which is set for the A/D conversion unit 20. Then, the intermediate digital signal, outputted from the A/D conversion unit 20, is attenuated in the digital attenuator 23 by 24 dB. Thus, the level of the digital output is returned to −99 dB which is equivalent to the level of the analog input. A change in the attenuation rate of the digital attenuator 23 can be performed by the bit-shift operation. A change in the gain of the analog amplifier 22 is embodied by a circuit whose configuration is shown in FIG. 9.

Figure 9:
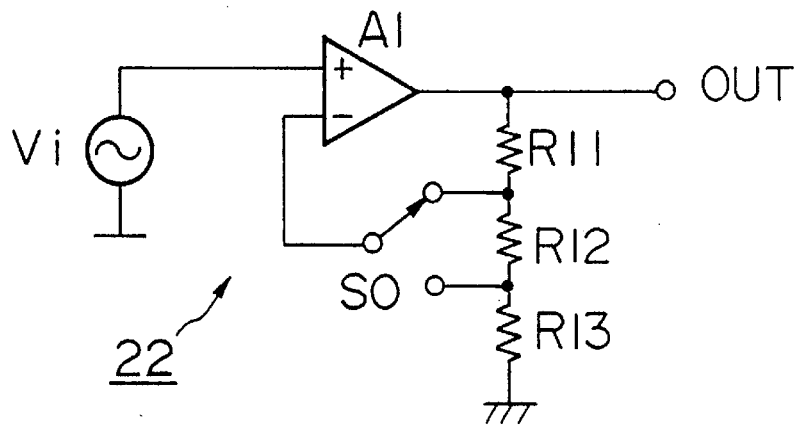
FIG. 9 is a circuit diagram showing an example of a detailed configuration of the analog amplifier shown in FIG. 8.

The analog amplifier 22 shown in FIG. 9 is configured by an operational amplifier A1, feedback resistors R11, R12, R13 and a switch S0. The operational amplifier A1 amplifies the analog input Vi. The combination of the feedback resistors R11, R12 and R13 is changed by the switch S0. Hence, a two-step change can be made for the control of the gain which is applied to the analog input Vi.

Figure 10:
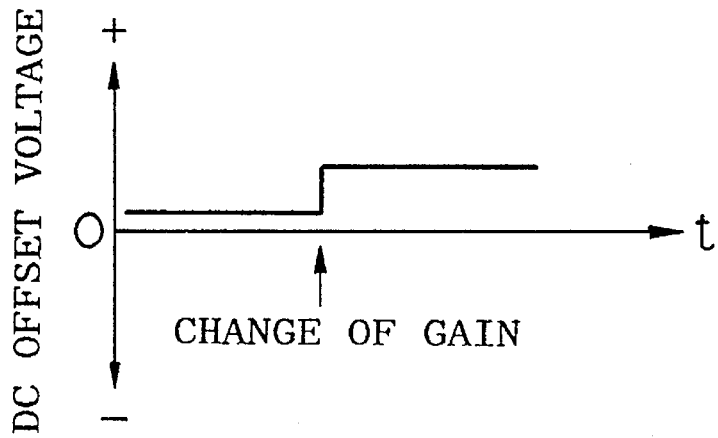
FIG. 10 is a graph showing an event in which a DC offset voltage of an operational amplifier, shown in FIG. 9, is changed responsive to a change of the gain.

In this type of analog amplifier, a DC offset voltage may inevitably emerge due to the operational amplifier A1. If the DC offset voltage is not zero, the DC offset voltage should be changed in response to the change of the gain as shown in FIG. 10. So, the analog amplifier shown in FIG. 9 may suffer from a problem that the change of the DC offset voltage will cause the noise.

Figure 12:
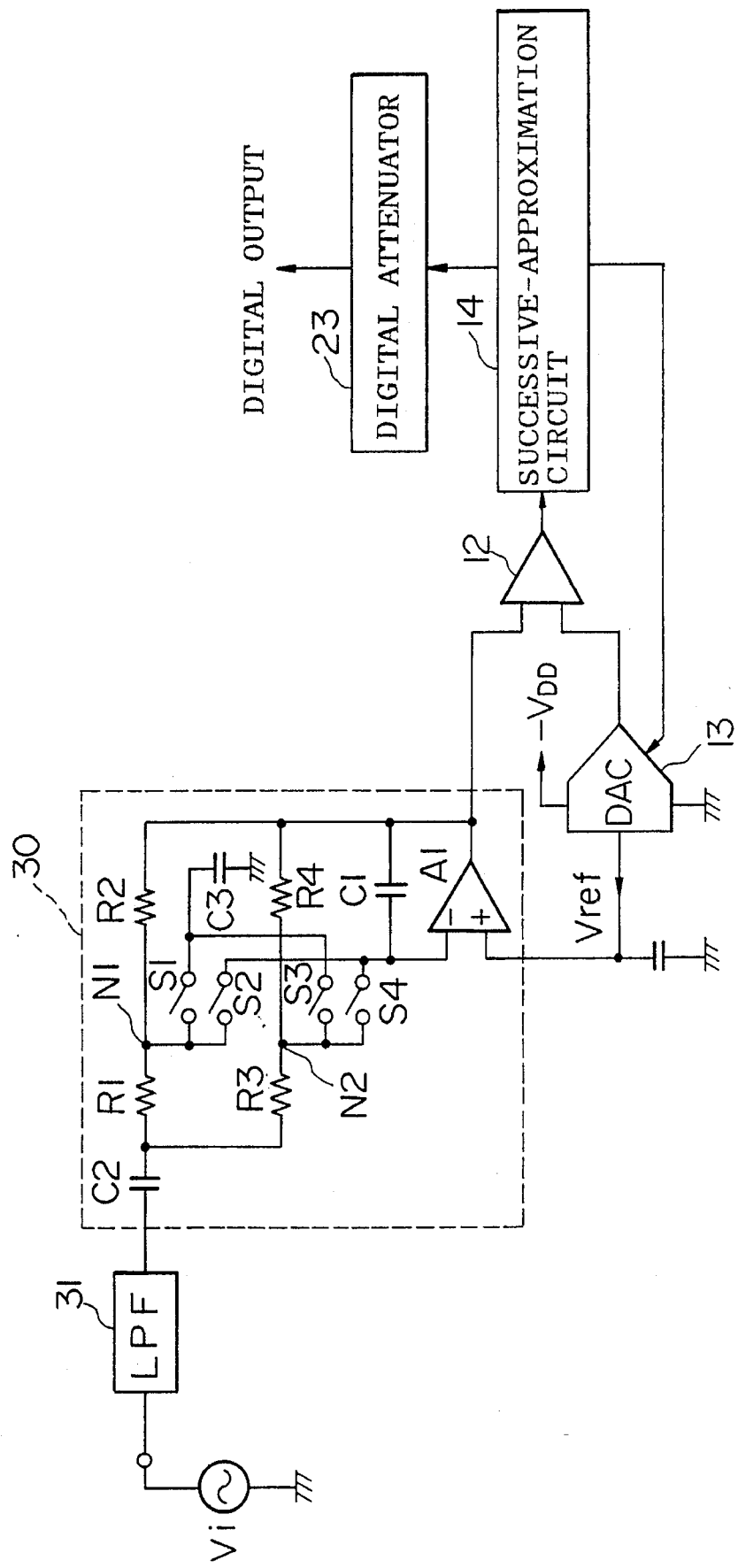
FIG. 12 is a block diagram showing an example of a detailed configuration of the A/D converter according to the second embodiment.

FIG. 12 shows a circuit configuration of a sample-and-hold-type analog amplifier 80 which does not suffer from the problem due to the DC offset voltage. This analog amplifier 30 is connected with a low-pass filter 31 (i.e., LPF) through which the analog input Vi is supplied. An overall configuration of the circuitry shown in FIG. 12 is basically equivalent to that of the circuitry shown in FIG. 8.

Figure 11:
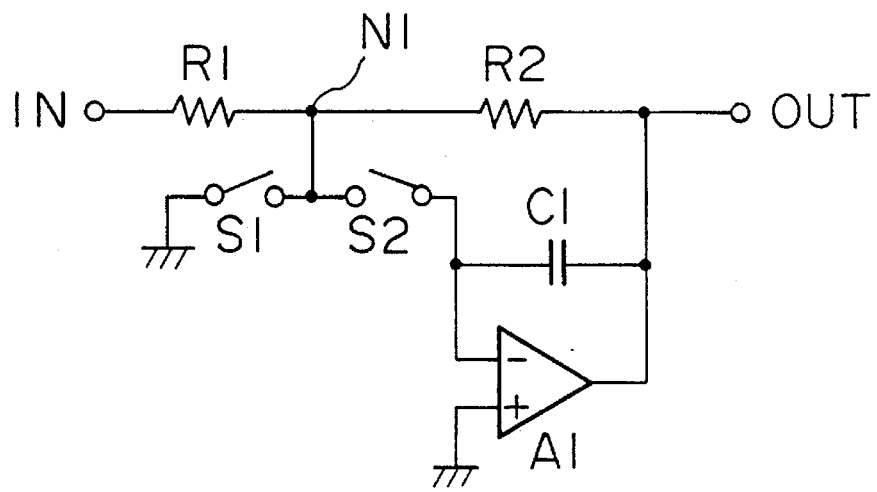
FIG. 11 is a circuit diagram showing an example of a detailed configuration of a sample-and-hold circuit which is used as a part of the analog amplifier.

Before describing the circuitry of FIG. 12, fundamental configuration and operation of the sample-and-hold circuit will be described with reference to FIG. 11. In FIG. 11, a series circuit consisting of resistors R1 and R2 is connected between an input terminal 'IN' and an output terminal 'OUT'. Two switches S1 and S2, which are alternately turned on or off, are connected to a connecting point 'N1' between the resistors R1 and R2. When the switch S2 is turned on while the switch S1 is turned off, a sampling capacitor C1 is charged in accordance with a time constant C1.R1. At this time, the sample-and-hold circuit shown in FIG. 11 as a whole acts like a reverse amplification circuit.

Next, when the switch S1 is turned on while the switch S2 is turned off, the connecting point N1 is grounded through the switch S1; and an electric charge of the capacitor C1 is held as it is.

By repeating the above-mentioned operations of the switches S1 and S2, the sample-and-hold operations are performed on the input signal.

The sample-and-hold-type analog amplifier 30, shown in FIG. 12, contains two series of circuits, each of which is like a circuit shown in FIG. 11, in order to provide two gains. The analog amplifier 30 is configured by resistors R3, R4, switches S3, S4 and capacitors C2, C3 as well as the resistors R1, switches S1, S2, the capacitor C1 and the operational amplifier A1. The series circuit consisting of the resistors R1 and R2 is connected in parallel with a series circuit consisting of the resistors R3 and R4. The capacitor C2 is provided between the low-pass filter 31 and a connecting point between the resistors R1 and R3. The connecting point N1 is grounded through the switch S1 and the capacitor C3 in series. A connecting point 'N2' between the resistors R3 and R4 is connected to a connecting point, between the switch S1 and the capacitor C3, through the switch S3. The connecting point N2 is also connected to a connecting point, between the switch S2 and the capacitor through the switch S4. As similar to the switches S1 and S2, the switches S3 and S4 are alternately turned on or off. The capacitor C3 is provided to cut off the DC component in the analog signal. Similarly, the capacitor C2 is provided to cut off the DC component in the analog signal.

A center potential of the power-supply voltage should be supplied to a non-inversion terminal '+' of the operational amplifier A1. However, in the circuitry shown in FIG. 12, the reference voltage 'Vref', which is extracted from an center tap (not shown) of the D/A converter 13, is applied to the non-inversion terminal of the operational amplifier A1.

The analog amplifier 30 is designed to perform two kinds of sampling operations on the analog signal supplied thereto through the low-pass filter 31. In order to set the same time constant for each of the sampling operations, the resistors R2 and R4 are set equivalent with each other in resistance (i.e., R2=R4). If the same resistance 'R' is selected for both of the resistors R2 and R4 and the other resistors are set in such a manner that Ri=R and R3=R/4, the gain A can be set at a value '1' or '4' in turn by operating the switches S3 and S4. For example, if the switches S1 and S2 are alternately turned on or off under the condition where the switch S3 is turned on while the switch S4 is turned off, the gain A can be expressed as follows:

$$A=R2/R1=R/R=1$$

On the other hand, If the switches S3 and S4 are alternately turned on or off under the condition where the switch S1 is turned on while the switch S2 is turned off, the gain A can be expressed as follows:

$$A=R2/R3=R/(R/4)=4$$

A DC-feedback amount, applied between an inversion terminal '−' and an output terminal of the operational amplifier A1 is set at 100% because the capacitors C2 and C3 are used to cut off the DC components in the analog signal. A certain feedback ratio is maintained for the operational amplifier A1 even if a ratio among the resistors R1 to R4 is arbitrarily changed. In other words, there is no change in the DC offset voltage, regardless of the change of the gain. In short, the change of the gain, in tile analog amplifier 30 shown in FIG. 12, does not contribute to the generation of the noise, which is conventionally generated due to the change of the gain.

The analog amplifier 30 provides two series of circuits so as to make a two-step change in the gain. However, the number of those circuits is not limited to two. If there are provided three series of circuits in the analog amplifier, it is possible to increase the number of steps for changing the gain.

Lastly, this invention may be practiced or embodied in still other ways without departing from the spirit or essential character thereof as described heretofore. Therefore, the preferred embodiments described herein are illustrative not restrictive, the scope of the invention being indicated by the appended claims and all variations which come within the meaning of the claims are intended to be embraced therein.

What is claimed is:

1. An analog-to-digital converter for receiving an analog input and producing an N-bit digital output, the analog-to-digital converter comprising:

reference-voltage generating means for generating a reference voltage whose level is successively altered;

first and second switches which are alternately turned on, the reference voltage being transmitted through the first switch and an analog-input voltage, corresponding to the analog input to be converted, being transmitted through the second switch; and comparing means for comparing the reference voltage and the analog-input voltage, which are alternately supplied thereto through the first and second switches, so as to determine a bit in the digital output produced by converting the analog input;

the comparing means at least comprising a capacitor and a parallel circuit consisting of an inverter and a third switch, wherein one terminal of the capacitor is commonly connected to the first and second switches, while another terminal of the capacitor is connected to the parallel circuit, and a capacitance of the capacitor is changed in response to an input voltage to the capacitor.

2. The analog-to-digital converter as recited in claim 1, wherein the reference-voltage generating means comprises a digital-to-analog converter which receives digital data, the digital data being determined on the basis of the digital output.

3. The analog-to-digital converter as recited in claim 1, further comprising a sample-and-hold circuit which receives the analog input, the analog input being sampled and held by the sample-and-hold circuit and transmitted to the comparing means through the second switch.

4. The analog-to-digital converter as recited in claim 1, wherein the capacitance of the capacitor is changed in such a manner that the capacitance is increased when the level of the input voltage is relatively small, but the capacitance is decreased when the level of the input voltage is relatively large.

5. The analog-to-digital converter as recited in claim 1, wherein the comparing means includes two capacitors which are connected in parallel, the two capacitors being simultaneously used when the level of the input voltage is relatively small but only one capacitor being used when the level of the input voltage is relatively large.

6. An analog-to-digital converter comprising:

analog amplifier means for amplifying an analog input by a gain, which is designated in advance, to produce an intermediate analog signal;

analog-to-digital conversion means for converting the intermediate analog signal to an intermediate digital signal;

digital attenuator means for attenuating the intermediate digital signal by an attenuation rate to produce a digital output which is an equivalent of the analog input, the attenuation rate being determined such that a product, obtained by multiplying the gain and the attenuation rate together, is normally equal to unity; and analog comparator means for making a judgement as to whether or not the level of the analog input belongs to a predetermined level range, said analog comparator means controlling the gain of the analog amplifier means in response to a result of the judgement, wherein the analog amplifier means includes filter means to remove the DC component of the analog input so that a change in the gain of the analog amplifier means does not cause noise.

7. The analog-to-digital converter as defined in claim 6, wherein the analog amplifier means includes:

two series of resistors connected in parallel for providing two possible gains in the analog amplifier;

an operational amplifier, an input terminal of the operational amplifier receiving a reference signal; and a single sampling capacitor connected between another input terminal of the operational amplifier and an output terminal of the operational amplifier wherein the two series of resistors commonly utilize the single sampling capacitor, and one of the two series of resistors is selectively combined with the sampling capacitor to select one of the two possible gains to be used in the amplifying of the analog input.

8. The analog-to-digital converter as defined in claim 7, wherein the filter means in the analog amplifier means includes:

a first filtering capacitor connected between an input to the analog amplifier means, which is the input that receives the analog input, and the remainder of the analog amplifier means for filtering a DC component out of the analog input before it is amplified; and a second filtering capacitor, one terminal of the second capacitor being connected to a ground potential and another terminal of the second capacitor being selectively coupled to the input terminal of the operational amplifier that is connected to the sampling capacitor.

9. The analog-to-digital converter as defined in claim 6, wherein the filter means includes:

a first capacitor connected between an input to the analog amplifier means, which is the input that receives the analog input, and the remainder of the analog amplifier means for filtering a DC component out of the analog input before it is amplified; and a second capacitor, one terminal of the second capacitor being connected to a ground potential and another terminal of the second capacitor being selectively coupled to one input terminal of an operational amplifier that is provided in the analog amplifier means.

10. An analog-to-digital converter comprising:

an analog amplifier for amplifying an analog input by a gain, which is selected from a plurality of gains determined in advance, to produce a first analog signal;

a digital-to-analog converter for producing a second analog signal;

a comparator for comparing the first analog signal with the second analog signal to produce a comparison signal;

a successive-approximation circuit for producing a first digital signal and an s-a output signal on the basis of the comparison signal, the first digital signal being supplied to the digital-to-analog converter so that the digital-to-analog converter produces the second analog signal in accordance with the first digital signal; and a digital attenuator for attenuating the s-a output signal by an attenuation rate to produce a second digital signal, the attenuation rate being determined such that a product, obtained by multiplying the gain and the attenuation rate together, is normally equal to unity, the second digital signal being outputted as a digital output which is an equivalent of the analog input, wherein the analog amplifier includes at least one capacitor to eliminate the generation of noise caused by a DC offset voltage when the gain of the analog amplifier is changed.

11. The analog-to-digital converter as recited in claim 10, wherein the analog amplifier further comprises:

a circuit for providing two possible gains in the analog amplifier, the circuit including an operational amplifier, a single sampling capacitor, and two series of resistors which are connected together in parallel, wherein the two series of resistors commonly utilize the single sampling capacitor which is connected between one input terminal of the operational amplifier and an output terminal of the operational amplifier, another input terminal of the operational amplifier receives a reference signal, and one of the two series of resistors is selectively combined with the sampling capacitor to select one of the two possible gains to be used in the amplifying of the analog input.

12. The analog-to-digital converter as defined in claim 8, wherein the analog amplifier further comprises:

a first filtering capacitor connected between an input to the analog amplifier, which is the input that receives the analog input, mid the remainder of the analog amplifier for filtering a DC component out of the analog input before it is amplified; and a second filtering capacitor, one terminal of the second capacitor being connected to a ground potential and another terminal of the second capacitor being selectively coupled to the input terminal of the operational amplifier that is connected to the sampling capacitor.

13. The analog-to-digital converter as defined in claim 7, wherein the s-a output signal is the same as the first digital signal.

14. The analog-to-digital converter as defined in claim 7, further comprising a low pass filter for filtering the analog input before it is amplified by the analog amplifier.

15. The analog-to-digital converter as defined in claim 7, wherein the analog amplifier includes:

an operational amplifier;

a first capacitor connected between an input to the analog amplifier, which is the input that receives the analog input, and the remainder of the analog amplifier, for filtering a DC component out of the analog input before it is amplified; and a second capacitor, one terminal of the second capacitor being connected to a ground potential and another terminal of the second capacitor being selectively coupled to one input terminal of the operational amplifier, wherein the first and second capacitors eliminate the generation of noise caused by a DC offset voltage when the gain of the analog amplifier is changed.

16. The analog-to-digital converter as defined in claim 15, further comprising a low pass filter for filtering the analog input before it is filtered by the first capacitor of the analog amplifier.

* * * * *